United States Patent [19]
Piper et al.

[11] Patent Number: 6,033,268
[45] Date of Patent: *Mar. 7, 2000

[54] MODULAR I/O SYSTEM WITH TWO-WAY CONNECTORS BETWEEN UNITS AND A COMMON LOCK FOR MULTIPLE PLUG-IN MODULES

[75] Inventors: Timothy R. Piper, Monroeville; Robert T. Kissell, Sr., Sarver; Daniel A. Hosko, Pittsburgh; Daniel L. Simon, Glenshaw; Matthew B. Horne, Allison Park, all of Pa.

[73] Assignee: Westinghouse Electric Corporation, Pittsburgh, Pa.

[*] Notice: This patent issued on a continued prosecution application filed under 37 CFR 1.53(d), and is subject to the twenty year patent term provisions of 35 U.S.C. 154(a)(2).

[21] Appl. No.: 08/846,946

[22] Filed: Apr. 30, 1997

[51] Int. Cl.[7] .................................................. H01R 9/22
[52] U.S. Cl. ........................................ 439/715; 439/953
[58] Field of Search ................................. 439/701, 712, 439/715, 717, 953, 709, 716

[56] References Cited

U.S. PATENT DOCUMENTS

| | | | |
|---|---|---|---|
| 3,042,895 | 7/1962 | Bonhomme | 439/717 |
| 3,189,866 | 6/1965 | Lazar et al. | 439/717 |
| 3,852,703 | 12/1974 | Carney et al. | 439/953 |
| 4,509,258 | 4/1985 | Locati et al. | 439/715 |
| 5,310,352 | 5/1994 | Mroczkowski et al. | 439/953 |
| 5,368,496 | 11/1994 | Renalletta et al. | 439/953 |
| 5,431,582 | 7/1995 | Carvalho et al. | 439/953 |
| 5,562,458 | 10/1996 | Stora et al. | 439/953 |
| 5,655,922 | 8/1997 | Dux et al. | 439/717 |

*Primary Examiner*—Hien Vu
*Attorney, Agent, or Firm*—Marshall, O'Toole, Gerstein, Murray & Borun

[57] ABSTRACT

The bases of modular units of an I/O system are connected serially by two-way electrical and mechanical connectors so that units can be inserted into and removed from lines of units connected to a controller without removal or movement of any other unit. By two-way connector is meant that confronting connectors on adjacent units disengage by movement in the same or opposite direction from that in which they engaged. The electrical connectors distribute a communication bus and power to the modular units. In addition, plug-in electronics modules and personality modules, with the latter providing selective interfaces between the electronics modules and banks of terminals for landing field wiring, have a common locking mechanism for locking both in sockets in the bases. The locking mechanism includes at least one locking assembly having a shaft rotatable from a free end of the electronics module for rotating a paddle into and out of engagement with a catch in the base. Overlapping shoulders prevent removal of the personality module without first unlatching and removing the electronics module.

26 Claims, 9 Drawing Sheets

MODULAR I/O SYSTEM WITH TWO-WAY CONNECTORS BETWEEN UNITS AND A COMMON LOCK FOR MULTIPLE PLUG-IN MODULES

CROSS REFERENCE TO RELATED APPLICATIONS

Commonly owned, concurrently filed U.S. patent application Ser. No. 08/846,943 entitled: MODULAR INPUT/ OUTPUT SYSTEM WITH FLEXIBLE INTERFACE WITH FIELD WIRING.

Commonly owned, concurrently filed U.S. patent application Ser. No. 08/846,400 entitled: A MODULAR INPUT/ OUT SYSTEM WITH REDUNDANCY AND TESTING.

BACKGROUND OF THE INVENTION

1. Field of the Invention

This invention relates to input/output apparatus for interfacing field wiring with electrical control and monitoring systems. In particular, it relates to a modular system having multiple strings of modular units serially connected to a process controller with each of the modular units having multiple plug-in modules. More particularly it relates to arrangements for connecting the modular units in series and locking the multiple modules in the modular units.

2. Background Information

Electronic control systems and monitoring systems such as process control systems require communication with the real world. This includes receiving inputs such as commands and process conditions provided by various sensors, transducers and/or contacts, generating outputs such as control signals, status and results. This interaction is provided by input/output (I/O) hardware and/or firmware. The signals that pass through the I/O can be analog and/or digital in nature. Typically, the I/O interface includes signal processing circuitry, which for example can limit the range of analog signals, provide filtering, amplification or attenuation, surge protection, isolation, pulse shaping for digital signals, analog to digital conversation for inputs, digital to analog conversion for outputs, and other signal conditioning.

Conventionally, the input/output function has been performed by circuitry implemented on plug-in I/O cards mounted in racks within I/O cabinets. U.S. Pat. No. 5,472, 347 suggests a modular I/O system in which a selection of I/O cards each packaged in an electronics module can be plugged into a base having a backplane providing connections between circuits in the electronics module and terminals to which the field wiring is connected. The base units are mounted side-by-side on a standard DIN rail and plugged into one another using one-way connectors for communication with a controller over a common bus system. These one way connectors utilize conventional male/ female connecting elements which require reciprocal axial movement for engagement and disengagement. In order for modular units to be inserted or removed from a string of modular units without moving adjacent units, one of the connector elements is mounted on a slide which moves axially on the modular unit. In addition to requiring this additional manipulation, the connectors can be only engaged or disengaged when the electronics modules are removed from the base units.

In the system of U.S. Pat. No. 5,472,347, the electronics modules are locked into the base by a cantilevered integral latch on the base. This latch is difficult to access, especially in high density installations where adjacent strings of serially connected modular units are close together so that a tool is required to operate the otherwise manually operable latch.

There is a need, therefore, for an improved I/O apparatus for connecting field wiring with a process control system or a monitoring system.

This includes a need for an improved modular I/O system for such applications.

In particular, there is an need for an improved modular I/O system in which individual modular units can be inserted into or removed from an interconnected string of units without disturbing adjacent units and without the requirement for separate manipulation of connectors.

There is an additional need for an improved modular I/O system which has a more accessible arrangement for locking electronics modules into the bases of the modular units.

There is also a need for an improved modular I/O system having a simple locking arrangement for locking multiple electronics modules in a base of a modular unit.

SUMMARY OF THE INVENTION

These needs and others are satisfied by the invention which is directed to a modular I/O system for field wiring in which individual modular units in a string of modular units can be electrically connected and disconnected while being inserted in or withdrawn from the string of units without disturbing adjacent units. The invention is further directed to such a modular I/O system in which plug-in electronics modules are locked into bases of the modular units by a locking assembly which is accessible from the free end of the plug-in module, and in which a common locking assembly locks multiple modules into the bases.

More particularly, the invention is directed to a modular I/O system which includes a removable electronics module comprising a housing having a proximal end engaging a socket in a base. The housing of the removable electronics module projects outward from the base when the proximal end is engaged in the socket so that a distal end of the housing is spaced from the base. The electronics module is locked in the socket by locking means comprising at least one locking assembly including a shaft extending from the distal end of the housing to the proximal end, an engagement member on a first end of the shaft adjacent to the proximal end of the housing, a catch member in the socket in the base, and an actuator on the second end of the shaft adjacent to the distal end of the housing which provides the means for manipulating the shaft from the distal end of the housing to engage and disengage the engagement member with the catch member. This arrangement permits the electronics module to be latched and unlatched from the distal end of the module which is more accessible.

Preferably, the engagement member of the locking assembly is a paddle extending laterally from the shaft for engagement and disengagement with the catch member through rotation of the shaft by the actuator means. More preferably, the actuator comprises a projection extending transversely from adjacent the second end of the shaft. This projection is parallel with the adjacent edge of the housing of the electronics module when the shaft is in a position in which the paddle is in engagement with the catch member. The projection extends laterally outward from the housing to provide a visual indication that the electronics module is not locked when the paddle is disengaged from the catch member. The locking means can also include aligning means rotating the shaft to position the paddle for engagement with the catch member as the electronics module is inserted into the socket in the base. Thus, if the locking means is in a locked position as the module is inserted in the socket, this alignment means will open the latch to position the paddle for engagement with the catch member. Preferably, the alignment means comprises a camming surface adjacent the socket which is engaged by the paddle and rotationally positions the paddle for engagement with the catch member as the electronics module is inserted into the socket.

The actuator includes a sector of a cylinder concentric with and adjacent the second end of the shaft and the housing has a recess adjacent the distal end with a cylindrical surface complimentary to the sector of the cylinder on the actuator. The cylinder on the actuator has an axially extending rib which engages an axially extending groove on the cylindrical surface in the recess of the housing forming a detente to retain the paddle in engagement with the catch member. This enables the locking mechanism to satisfy seismic testing required for critical applications.

As another aspect of the invention, the above locking assembly serves as a part of a common locking arrangement for locking the electronics module and a second plug-in module in the base. Interlock means prevents removal of the second module before the first module, so that the above-described locking assembly serves as the common locking means. The interlock means comprises overlapping projections on the sides of the first or electronics module and the second module. Preferably the overlapping projections comprise shoulders formed by offset sections on the sides of the two modules.

As another aspect of the invention, the modular I/O system includes mounting means mounting a plurality of modular units end-to-end using two-way electrical connectors on the ends of adjacent modular units which engage to connect through leads in the plurality of modular units together in a line. By two-way electrical connectors it is meant that confronting connectors on adjacent modular units disengage by moving in the same or opposite direction from that in which they engaged. These two-way electrical connectors are mounted on the bases so that they engage and disengage through movement transverse to the longitudinal axis, so that modular units can be inserted and removed from the line without movement of any other module.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
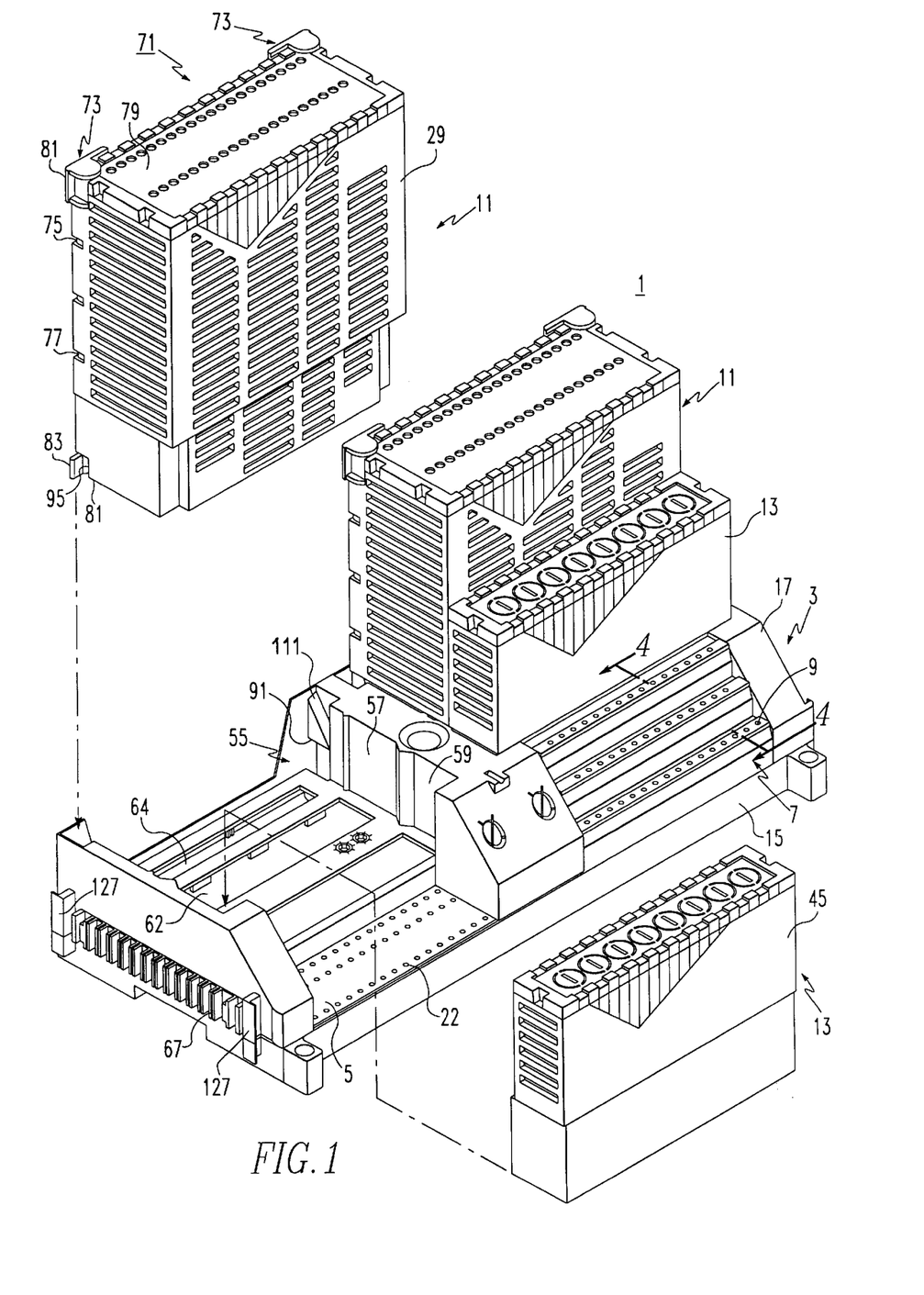
FIG. 1 is exploded isometric view of a modular I/O unit in accordance with the invention.
Figure 1A:
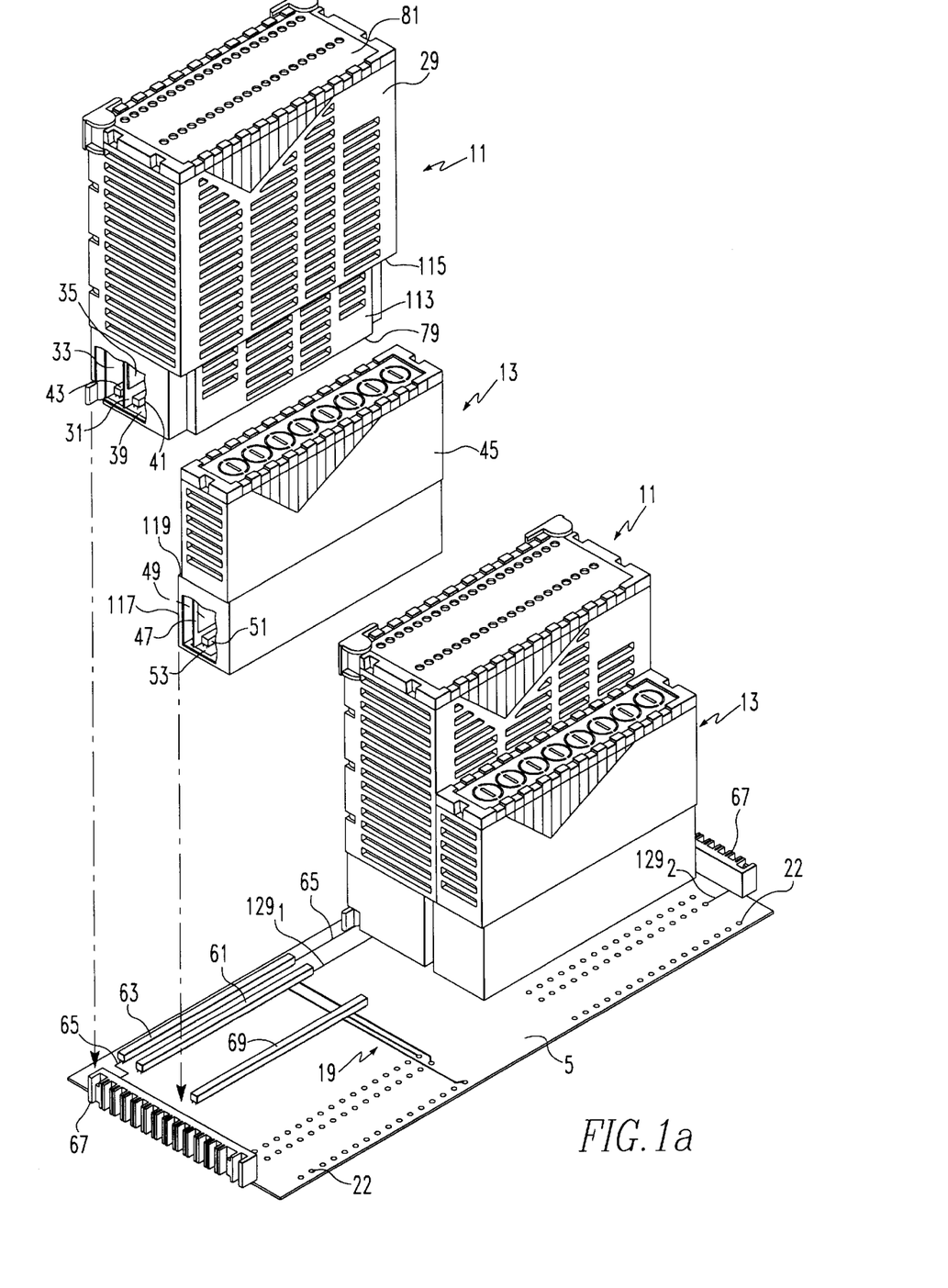
FIG. 1a is a exploded isometric view showing the interconnection of modules with a backplane within the modular I/O unit.
Figure 2:
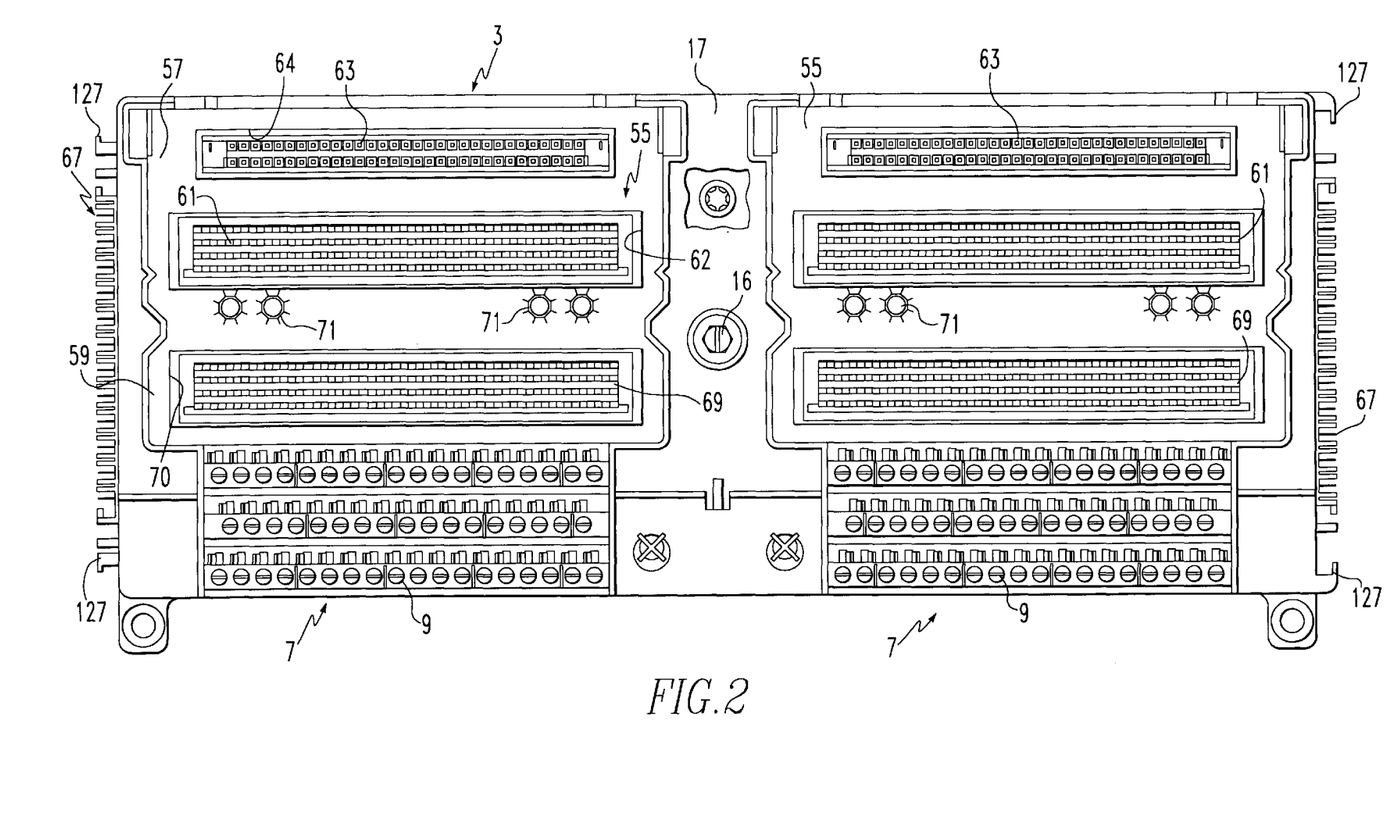
FIG. 2 is a view of the housing of the modular I/O unit of FIG. 1 with the electronics and personality modules removed.
Figure 3:
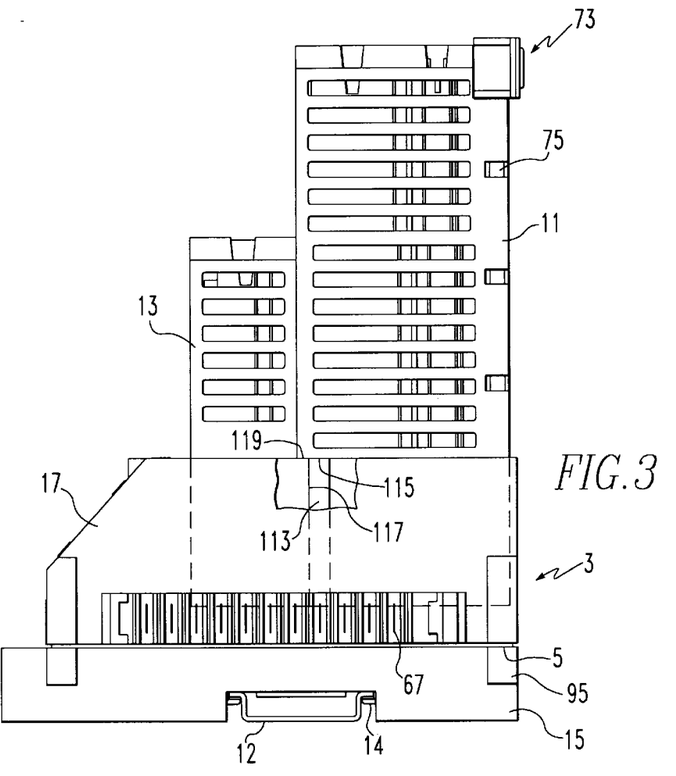
FIG. 3 is a side view of the I/O modular unit of FIG. 1 shown assembled.

Referring to FIGS. 1, 1a, 2 and 3, the modular input/output (I/O) system 1 of the invention includes as its basic components a base 3 in which a backplane 5 and a bank 7 of electrical terminals 9 are permanently mounted, and a pair of interchangeable electronics modules 11 and personality modules 13. Base 3 includes a bottom member 15 and top member 17 between which the backplane 5 is clamped. The backplane 5 has a pattern 19 of electrical conductors, to be described in more detail below, which selectively connect terminals 9 to the electronics modules 11 and personality module 13. In the system shown, the housing 3 supports dual arrangements of terminals 9, electronics modules 11 and personality modules 13. It will be understood that other arrangements could include a housing or base mounting a single set of a bank of terminals, an electronics module and a personality module, or three or more sets of these components. The base 3 is secured to a mounting rail 12 such as a standard DIN rail by a clamp 14, as seen in FIG. 3. This clamp is actuated by a screw 16 accessible through the top member 17 of the base, as shown in FIG. 2.

Figure 4:
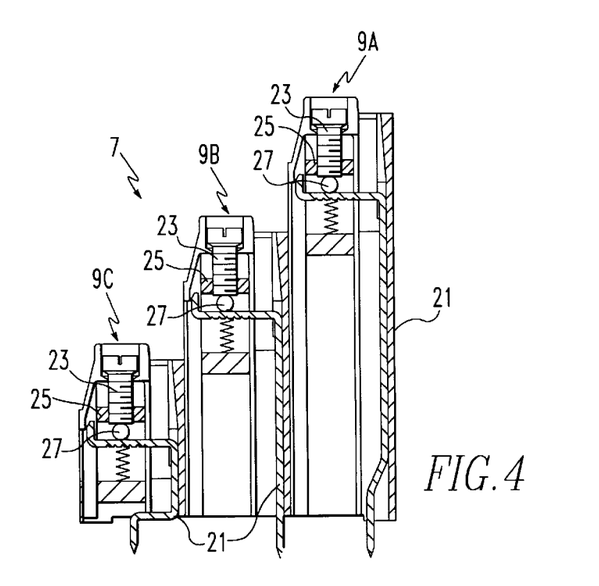
FIG. 4 is a sectional view through the terminals which form part of the modular I/O unit taken along the line 4—4 in FIG. 1.

The terminals 9 of each bank of terminals 7, are conveniently arranged in three tiers which can be labeled A, B and C for a three-phase electrical system. As shown in the cross-section of FIG. 4, each of the terminals includes a contact 21 which extends downward and terminates in a pointed end which engages holes 22 (see FIGS. 1 and 1a) in the backplane 5 where it is connected to the circuitry 19. Terminal screws 23 engaged in clamps 25 secure the contacts 21 to field wiring 27.

The electronics module 11 includes a housing 29 (see FIG. 1a) in which are mounted a pair of circuit cards 31 and 33. The circuit card 31 contains the I/O signal processing circuitry 35. Depending upon the particular application, signal processing circuitry 35 performs one or more functions which can include filtering, amplification or attenuation, surge protection, isolation, range limiting or scaling, and pulse shaping or other signal conditioning. The second card 33 in the electronics module housing 29 is the communications card through which signals are transmitted between the signal conditioning circuitry 35 and the processing system for which the I/O is provided. Mounted on the signal processing card 31 and the communications card 33 adjacent an opening 39 in the bottom in the housing 29 are electrical connectors 41 and 43, respectively.

The personality module 13 is a switching module. It includes a housing 45 containing a circuit card 47 having interface circuitry 49, which as will be seen, can have a plurality of configurations. An electrical connector 51 is provided on the bottom edge of the circuit card 47 adjacent an opening 53 in the housing 45.

The top member 17 of the base 3 has an opening 55 (see FIGS. 1 and 2) which forms side-by-side sockets 57 and 59 for plug in of the electronics module 11 and personality or switching module 13, respectively. Mounted on the backplane 5 in alignment with the socket 57 are electrical connectors 61 and 63 (see FIGS. 1a and 2) which mate with the connectors 41 and 43 in the electronics module. The connector 61 electrically connects the signal processing card 31 with the I/O circuits 19 on the backplane while the connector 63 connects the communications circuitry on the communications card 33 with communication busses indicated at 65 on the backplane (see FIG. 1a). Connectors 67 on each end of the backplane connect the communication busses 65 with adjacent I/O units 1 or a controller in a manner to be discussed. The connectors 67 and communications bus 65 provide power to the electronics module 11 in addition to routing signals to and from the modules.

In a similar manner, the connector 51 on the circuit card 47 of the personality or switching module 13 mates with a connector 69 on the backplane 5 to connect to the interface circuitry 49 with the circuits 19 as the personality module 13 is plugged into the socket 59. Preferably, octagonal keys on the backplane 5 assure that only an electronics module 11 of a given type having a matching key (not shown) can be plugged into the socket 57.

Figure 5A:
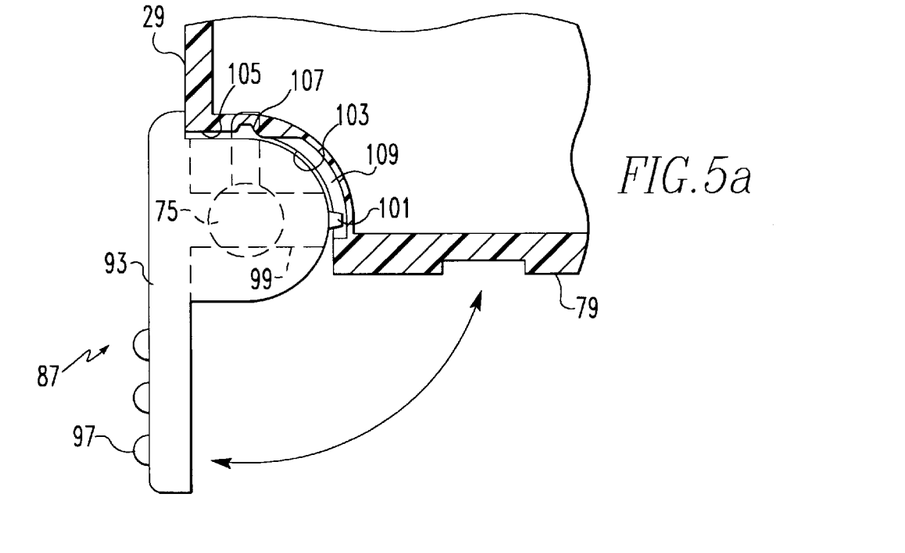
FIGS. 5a and 5b are fragmentary sectional views through a corner of an electronics module illustrating the positions of the actuator of the locking mechanism for locking the electronics module into the base shown in the unlocked and locked positions, respectively.
Figure 5B:
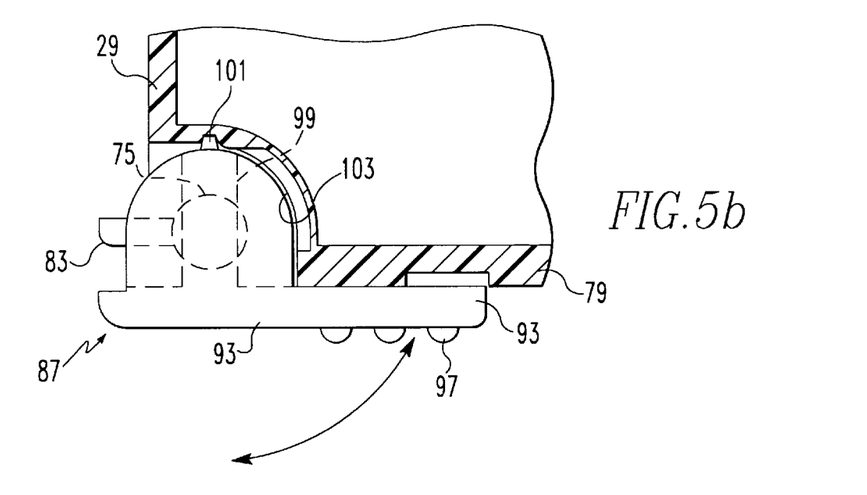
Figure 7A:
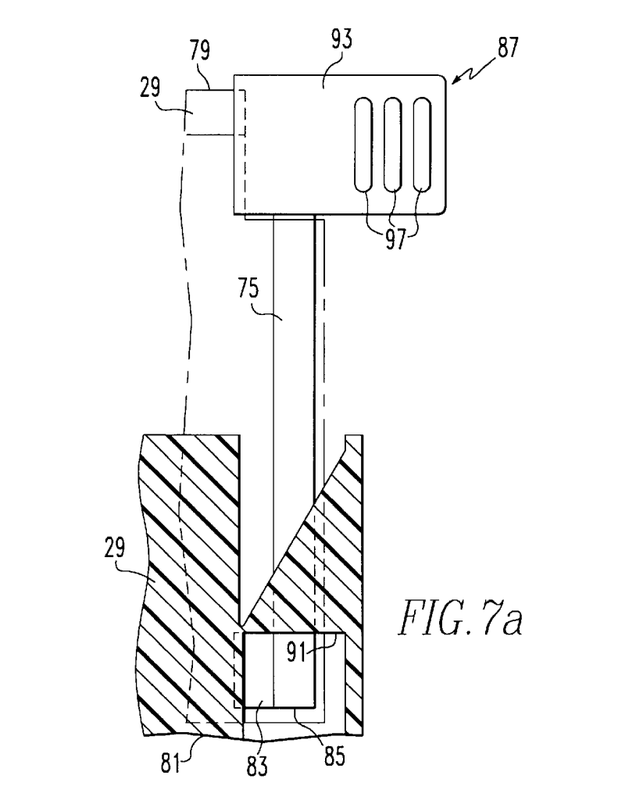
FIGS. 7a, 7b and 7c are similar to the FIGS. 6a, 6b and 6c, illustrating how the locking mechanism is automatically unlocked by insertion of the module into the base member.
Figure 8A:
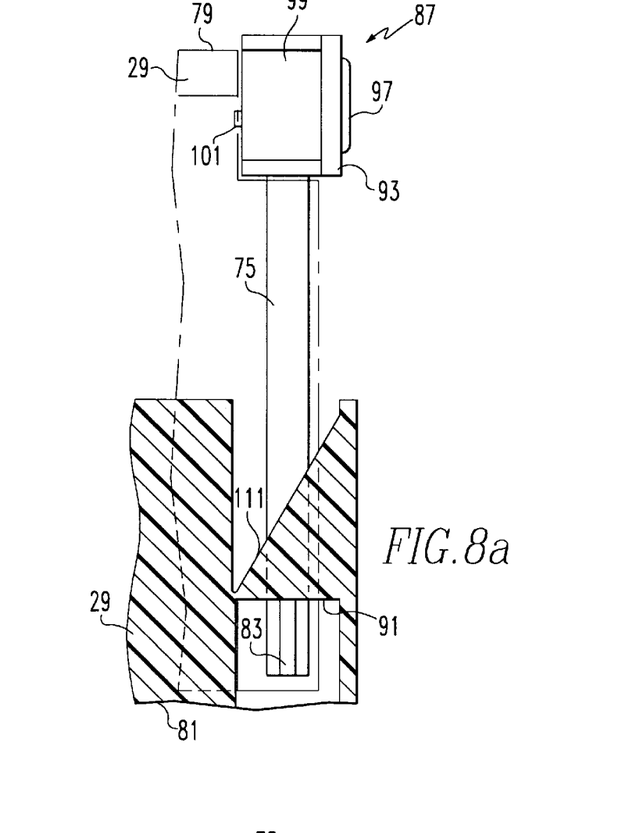
FIGS. 8a, 8b and 8c are similar to FIGS. 6a, 6b and 6c, illustrating the electronics module engaged with the base member and with the locking mechanism in the locked position.
Figure 8B:
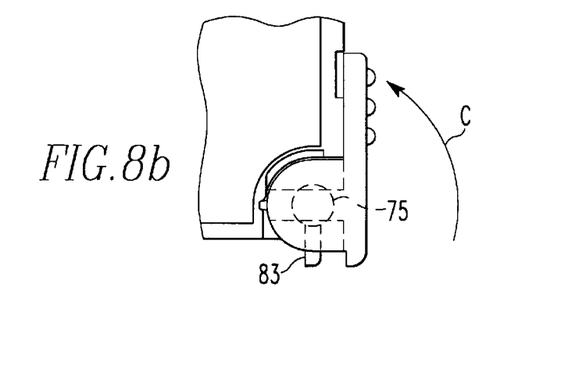
Figure 8C:
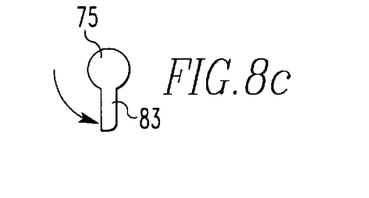

The electronic modules 11 and personality modules 13 are locked into the base 3 by a locking mechanism 71. This locking mechanism 71 includes two locking assemblies 73 provided in the rear corners of the electronics module 11, as can be seen in FIG. 1. Each of the locking assemblies 73 includes a shaft 75 journaled in a bore 77 extending through the corner of the housing 29 of the electronics module 11 from a distal end 79 to a proximal end 81. An engagement member in the form of a paddle 83 extends laterally from the first end 85 of the shaft 75 adjacent the proximal end of the housing 29. An actuator 87 on the second end 89 of the shaft 75 adjacent the distal end 79 of the housing 29 permits rotation of the shaft 75 from the distal end 79 of the housing to effect engagement and disengagement of the paddle 83 with a catch member in the form of a ledge 91 in the socket 57 of the base 3. As shown in FIGS. 5a and 5b, the actuator 87 includes a projection 93 extending tangentially from the shaft 75. When the projection 93 is rotated flush against the housing 29 of the electronics module 11, as shown in FIGS. 5b and 8b, the paddle 83 projects laterally outward, as shown in FIG. 8c to engage to ledge 91 as shown in FIG. 8a to lock the electronics module 11 in the base 3. When the actuator is rotated in the opposite direction to the position shown in FIG. 5a where the projection 93 extends laterally outward from the housing 29 of the electronics module 11, the paddle 83 is rotated into a recess 95 in the housing 29 so that it is disengaged from the ledge 91, as shown in FIG. 7a. Thus, the projection 93 on the actuator provides a clear visual indication of the condition of the locking mechanism 71. Ribs 97 on the projection 93 provide a better surface for gripping the actuator.

In order to retain the locking mechanism 71 in the locked condition and to meet seismic test requirements for critical applications, the body 99 of the actuator 87 has an axially extending rib 101 which projects laterally outward (see FIGS. 5a and 5b). The body 99 of the actuator 87 rotates in a generally arcuate pocket 103 in the corner of the distal end 79 of the housing 29. This arcuate pocket 103 has a flat surface 105 with an axially extending groove 107 which is engaged by the axially extending rib 101 when the actuator is rotated to the locked position. This rib 101 traverses in an arcuate slot 109 in the pocket 103 as the actuator is rotated to the unlocked position.

Figure 6A:
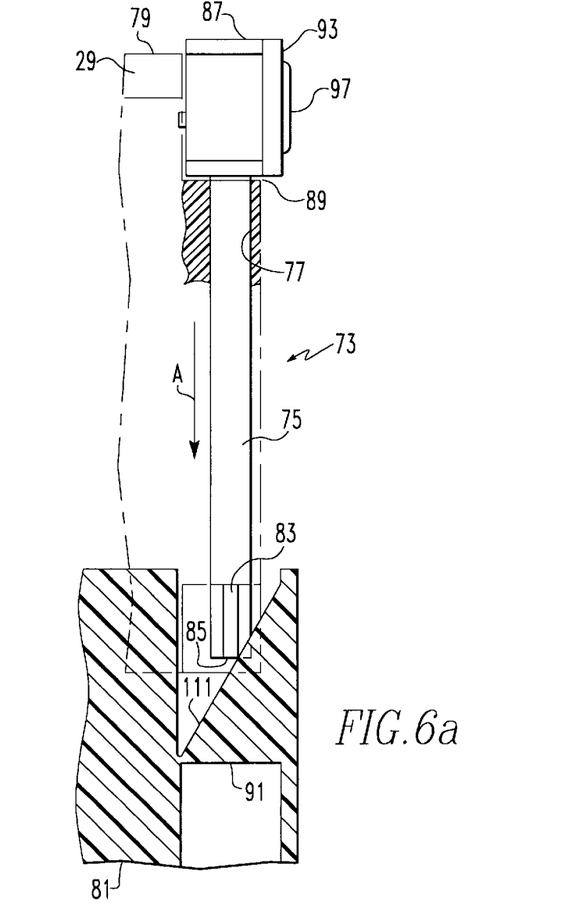
FIGS. 6a, 6b and 6c are elevation, top plan, and bottom plan views of the locking mechanism illustrating insertion of the module into the base with the locking mechanism in the locked position.
Figure 6B:
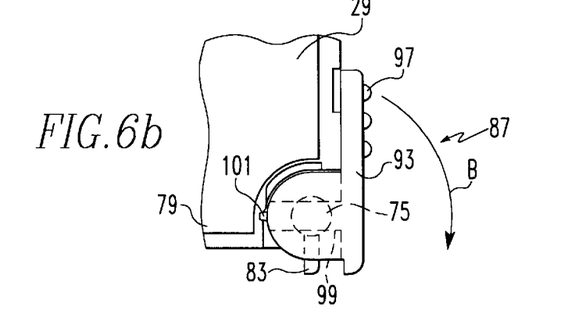
Figure 6C:
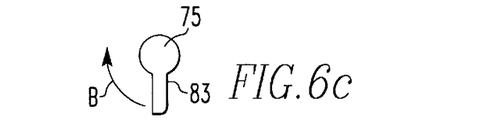
Figure 7B:
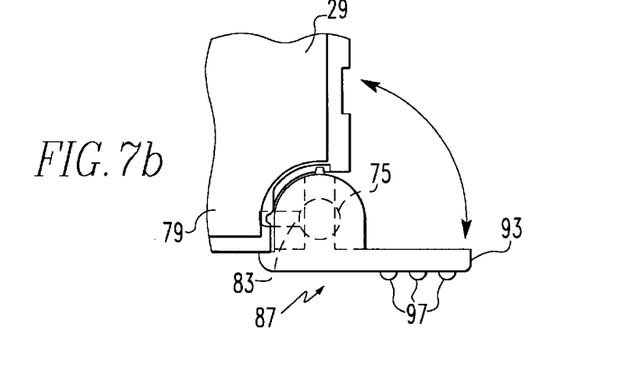
Figure 7C:
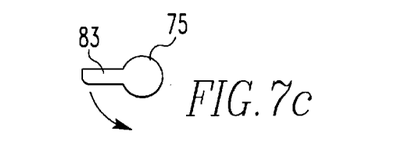

As another aspect of the invention, an alignment device in the form of an inclined camming surface 111, shown in FIGS. 1, 6a, 7a and 8a, automatically positions the locking assembly 73 for engagement of the paddle 83 with the catch member ledge 91 as the electronics module 11 is inserted into the base member 3. Thus, the locking assembly 73 does not have to be in the unlocked position for insertion of the electronics module 11 into the base member 3. This is illustrated as follows. If, as shown in FIGS. 6a, 6b and 6c, the electronics module 11 is inserted into the socket 57 with the locking assembly 73 in the locked position, the paddle 83 will be projecting laterally outward. With the paddle 83 in this position, it will engage the camming surface 111. As the electronics module 11 is pushed further into the socket 57 in the direction of arrow A in FIG. 6a, the paddle 83 and, therefore, the shaft 75 carrying with it the actuator 83 will be rotated in the direction of the arrow B in FIGS. 6b and 6c to the open position shown in FIGS. 7a, 7b and 7c. This will permit the electronics module 11 to be fully inserted into the socket 57 so that the electrical connectors in the base and in the electronic modules mate and the paddle 83 will be in the position shown in FIG. 7a for engagement with the ledge 91 of the catch mechanism. The actuator is then rotated in the direction of the arrow C in FIGS. 8b and 8c to bring the paddle 83 into engagement with the ledge 91, as shown in FIG. 8a.

As an additional aspect of the invention, the locking mechanism 71 serves as a common locking mechanism for retaining both the electronics module 11 and a personality module 13 locked in the base 3. Thus, as best seen in FIGS. 1a and 3, the front face of the housing 29 of the electronics module 11 has a recess 113 adjacent the distal end 79 facing the personality module 13 forming an undercut ledge 115. The housing 45 of the personality module 13 has a projection 117 complimentary to and facing the recess 113, which forms a step ledge 119. The personality module is plugged into the socket 59 first. When the electronics module 11 is subsequently plugged into the socket 57, the undercut ledge 115 on the electronics module abuts the step ledge 119 on the personality module to form an interlock so that the personality module cannot be removed without first removing the electronics module. Thus, by locking the electronics module in place with the locking assemblies 73, the personality module is also locked in the base member.

Figure 9:
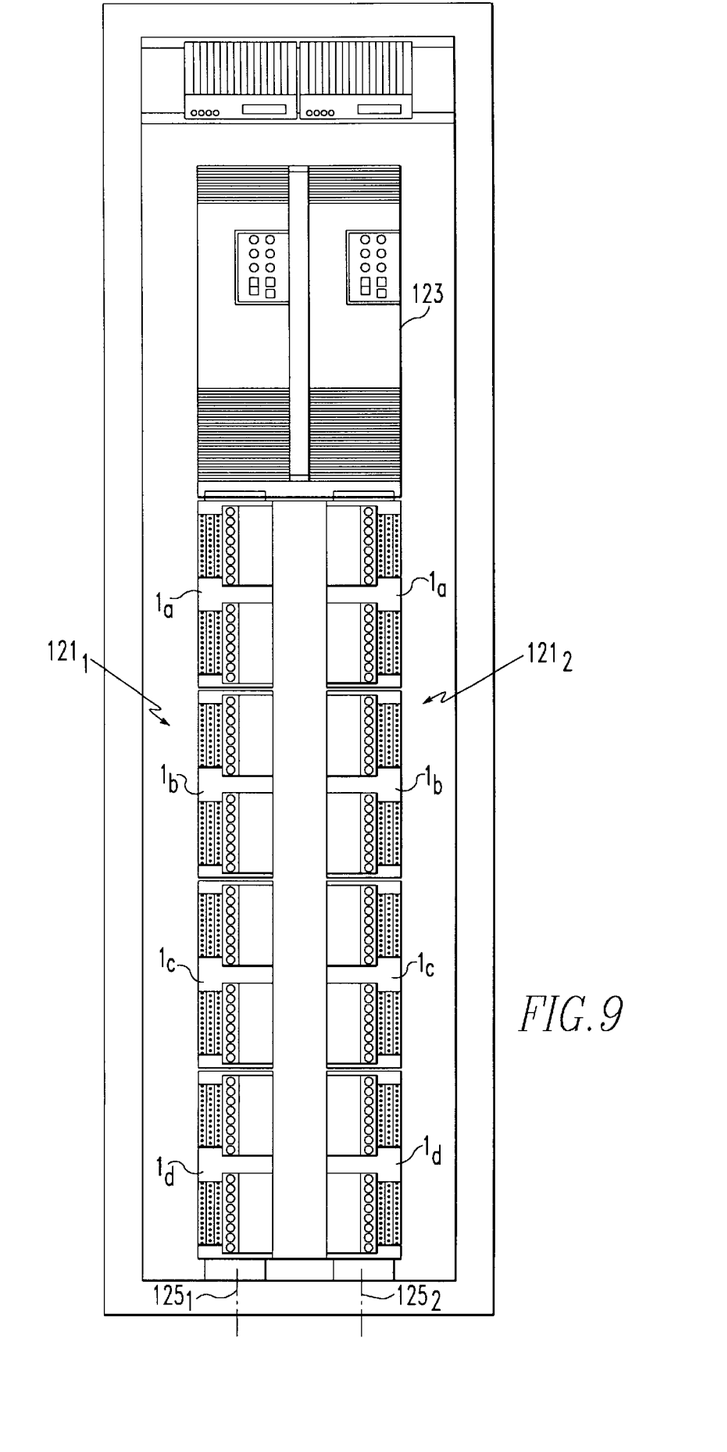
FIG. 9 is a front elevation view of a process control system incorporating a controller and a number of modular I/O units in accordance with the invention.

As shown in FIG. 9, the modular I/O unit 1 may be arranged in one or more branches such as $121_1$ and $121_2$ which are connected to a controller such as the single/redundant controller 123. Each of the branches 121 includes a plurality of serially connected I/O modules 1 mounted on a common mounting rail 12. A unique aspect of the invention is that the individual I/O modules 1 can be inserted and removed anywhere in a branch 121 and electrically connected to and disconnected from the adjacent modules merely by movement transverse to the longitudinal axis 125 of the branch. This is made possible by the two-way connectors 67 on the ends of the base 3. By two-way connectors, it is meant that confronting connectors 67 on adjacent modular units disengage by moving in the same or opposite direction from that in which they engaged. For instance, if the module $1_b$ is inserted into the branch $121_1$ with the modules $1a$ and $1_c$ already in place, the connectors 67 on each end of the module $1_b$ move in a first direction which is into the plane of FIG. 9 relative to the connectors 67 on the modules $1_a$ and $1_c$. If the module $1_b$ is then removed from the branch $121_1$, its connectors 67 would move in the opposite direction, out of the plane of FIG. 9 relative to the connectors 67 on the modules $1_a$ and $1_c$, as the module $1_b$ was withdrawn. However, if after the module $1_b$ is inserted between the modules $1_a$ and $1_c$ which were already in place, and then the module 1c is withdrawn from the branch $121_1$, so that the connectors 67 on the module 1c moves in the second direction out of the plane of FIG. 9, this is equivalent to the connectors 67 on the module 1b continuing in the first direction to disengage from the module 1c. The connectors 67 includes male connections in the form of stabs and female connections in the form of slots so spaced that the male connections slide into the female connections of confronting connectors 67. Complimentary hooks 127 molded into the ends of the base members 3 prevent lateral disconnection of the connector 67.

The connectors 67 can not only connect the communication busses 65 on adjacent modules, but can also provide connections for power leads 129 (see FIG. 1a) for distributing power to the individual I/O modules 1 with first power leads $129_1$, providing power to the circuit boards 31, 33, and 47 of the modules 11 and 13 and second power leads $129_2$ providing field power to some terminals 9.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A modular I/O unit for field wiring comprising:
    a base having a socket;
    a terminal bank on said base comprising a plurality of terminals, each of said terminals having a contact adapted to make an electrical connection with said field wiring;
    electrical conductors disposed in said base and exiting between said terminals and said socket;
    a removable electronics module comprising signal processing circuitry having electrical components disposed within a housing a promixal end engaging said socket and a distal end, wherein said signal processing circuitry connects with said electrical conductors in said base, and wherein said housing projects outward from said base when said proximal end is engaged in said socket with the distal end of said housing spaced from said base; and
    a locking mechanism locking said electronics module in said socket, said locking mechanism comprising at least one locking assembly including a shaft extending from said distal end of said housing to said proximal end, an engagement member on a first end of said shaft adjacent to said proximal end of said housing, a catch member in said socket in said base, and an actuator on a second end of said shaft adjacent to said distal end of said housing for manipulating said shaft from said distal end of said housing to engage and disengage said engagement member with said catch member and configured to provide a visual indication that said electronics module is not locked in said socket when said engagement member is disengaged from said catch member.

2. The modular I/O unit of claim 1, wherein said engagement member is a paddle extending laterally from adjacent said first end of said shaft for engagement and disengagement with said catch member through rotation of said shaft, and wherein said actuator comprises a projection that rotates said second end of said shaft.

3. The modular I/O unit of claim 2, wherein said actuator compromises a projection extending transversely from adjacent said second end of said shaft and which projection is flush with said housing when said shaft is in a first rotational position in which said paddle is in engagement with said catch member and which projection extends laterally outward from said housing to provide said visual indication that said electronics module is not locked in said socket when said paddle is disengaged from said catch member.

4. The modular I/O unit of claim 3, wherein said locking mechanism includes a camming surface that rotates said shaft to position said paddle for engagement with said catch member as said electronics module is inserted into said socket.

5. The modular I/O unit of claim 4, wherein said actuator includes a body concentric with and adjacent said second end of said shaft and having an axially extending rib thereon, said housing having a recess adjacent said distal end with a surface complimentary to said body of said actuator and having an axially extending groove forming a detent which is engaged by said rib on said body of said actuator to retain said paddle in engagement with said catch member.

6. The modular I/O unit of claim 5, wherein said housing is rectangular and said shaft extends through said housing adjacent a corner of the housing in which said recess is formed.

7. The modular I/O unit of claim 3, wherein said actuator includes a body concentric with and adjacent said second end of said shaft and having an axially extending rib thereon, said housing having a recess adjacent said distal end with a surface complimentary to said body of said actuator and having an axially extending groove forming a detente which is engaged by said rib on said body said actuator to retain said paddle in engagement with said catch member.

8. The modular I/O unit of claim 7, wherein said housing is rectangular and said shaft extends through said housing adjacent a corner of the housing in which said recess is formed.

9. A modular I/O unit for field wiring comprising:
    a base having first and second sockets;
    a terminal bank comprising a plurality of terminals, each of said terminals having a contact adapted to make an electrical connection with the field wiring;
    electrical conductors disposed in said base and extending between said terminals and said first and second sockets;
    a first removable circuit module comprising signal processing circuitry having electrical components, wherein said first removable circuit module plugs into said first socket and electrically connecting with said electrical conductors;
    a second removable circuit module comprising signal processing circuitry having electrical components, wherein the second removable circuit module plugs into second socket and electrically connecting with said electrical conductors; and
    a locking mechanism that mechanically locks both said first and second modules in said first and second sockets, respectively.

10. The modular I/O unit of claim 9, wherein said locking mechanism comprises at least one locking assembly mechanically locking said first module in said first socket and a ledge on one of said first and second modules for preventing removal of said second module from said second socket before said first module is removed from said first socket.

11. The modular I/O unit of claim 10, wherein said first and second sockets are positioned adjacent one another on said base and said ledge comprises a projection on a side of said one of said first and second modules.

12. The modular I/O unit of claim 11, wherein said overlapping projections comprise shoulders formed by offset sections of said sides of said first module and said second module.

13. The modular I/O unit of claim 12, wherein said first module comprises a housing having a proximal end which plugs into said first socket, said housing projecting away from said base member and terminating in a distal end spaced from said base, and said at least one locking assembly comprises a shaft extending through said first module from a first end adjacent said proximal end of said housing to a second end adjacent said distal end of said housing, a paddle extending transversely from adjacent said first end of said shaft, a catch member in said first socket in said base, and an actuator on said second end of said shaft for rotating said shaft to engage and disengage said paddle from said catch member.

14. A modular I/O system for field wiring comprising:
a plurality of modular units each having a base, a terminal bank comprising a plurality of terminals, each of said terminals having a contact adapted to make an electrical connection with said field wiring, through leads extending generally longitudinally through said base between ends of said base, electrical conductors selectively passing electrical signals between said terminals and said through leads, and two-way electrical connectors on each of said ends of said base connected to said through leads; and
a mounting assembly mounting said plurality of modular units end-to-end with said two-way electrical connectors on the ends of adjacent modular units engaging to connect said through leads in said plurality of modular units together generally in a line along a longitudinal axis, said two-way electrical connectors comprising interconnections which engage and disengage through movement transverse to said longitudinal axis, so that said modular units can be inserted and removed from said line without any movement of any other module.

15. The modular I/O system of claim 14, wherein some of said through leads are power leads, and others of said through leads form a communications bus, said electrical conductors in said modular units including circuitry selectively passing signals between said terminal bank and said communications bus.

16. The modular I/O system of claim 15, wherein said power leads include first power leads providing power to said electrical conductors, and second power leads connected to said terminals bank providing field power.

17. A modular I/O system for coupling a controller to field wiring comprising:
a mounting member;
a plurality of bases adapted to be operatively coupled to said mounting member, each base including;
a bottom member;
first and seconds sides;
a first two-way connector disposed on said first side of said base and having a first plurality of electrical connectors; and
a second two-way connector disposed on said second side of said base and having a second plurality of electrical connectors;
wherein said first two-way connector on a first one of said bases is adapted to engage said second two-way connector on a second one of said bases to provide electrical connection between said first and second bases, and wherein the mounting member is mounted to said bottom member of each of the plurality of bases.

18. The modular I/O system of claim 17, wherein said first two-way connector on a third one of said bases is adapted to engage said second two-way connector on said first one of said bases.

19. The modular I/O system of claim 17, wherein each of said first and second two-way electrical connectors includes a male section and a female section.

20. The modular I/O system of claim 19, wherein each of said female sections comprises a slot having two side walls and open ends between the two side walls.

21. The modular I/O system of claim 17, further comprising an electrical conductor on said base that connects the first two-way electrical connector and the second two-way electrical connector.

22. The modular I/O system of claim 21, wherein said electrical conductor comprises a power source conductor.

23. The modular I/O system of claim 21, wherein said electrical conductor comprises a communications signal conductor.

24. The modular I/O system of claim 17, wherein each of said bases includes a terminal bank having a plurality of terminals, each of said terminals having a contact adapted to make electrical connection with said field wiring.

25. The modular I/O system of claim 24, wherein each of said bases includes a socket adapted to accept a circuit module having signal processing circuitry.

26. The modular I/O system of claim 23 wherein each of said bases includes a complimentary hook on each of said first and second sides, said complimentary hook adapted to engage one of the complimentary hooks on other ones of said bases.

* * * * *

UNITED STATES PATENT AND TRADEMARK OFFICE
CERTIFICATE OF CORRECTION

PATENT NO. : 6,033,268
DATED : March 7, 2000
INVENTOR(S) : Piper et al.

It is certified that error appears in the above-identified patent and that said Letters Patent is hereby corrected as shown below:

In Claim 1, at Column 7, Line 35 "electrical" should be "electrical";

In Claim 1, at Column 7, Line 38, "exiting" should be "extending";

In Claim 1, at Column 7, Line 42, insert "having" between "housing" and "a proximal"; and In Claim 9, at Column 8, Line 56, insert "said" between "into" and "second."

Signed and Sealed this

Twenty-fourth Day of April, 2001

Attest:

NICHOLAS P. GODICI

Attesting Officer

Acting Director of the United States Patent and Trademark Office